United States Patent
Huang et al.

(10) Patent No.: US 10,523,002 B2
(45) Date of Patent: Dec. 31, 2019

(54) ELECTROSTATIC DISCHARGE PROTECTION CIRCUIT

(71) Applicant: Vanguard International Semiconductor Corporation, Hsinchu (TW)

(72) Inventors: Shao-Chang Huang, Hsinchu (TW); Jung-Tsun Chuang, Tainan (TW); Chieh-Yao Chuang, Kaohsiung (TW); Hung-Wei Chen, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 449 days.

(21) Appl. No.: 15/369,249

(22) Filed: Dec. 5, 2016

(65) Prior Publication Data

US 2018/0159323 A1  Jun. 7, 2018

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC ................. H02H 9/046; H01L 27/0248–0296
See application file for complete search history.

(56) References Cited

U.S. PATENT DOCUMENTS

| | | | | |
|---|---|---|---|---|
| 5,946,177 A | * | 8/1999 | Miller ................. | H01L 27/0248 361/56 |
| 7,102,862 B1 | * | 9/2006 | Lien .................... | H01L 27/0285 361/56 |
| 7,710,696 B2 | | 5/2010 | Ker et al. | |
| 7,760,477 B1 | * | 7/2010 | Watt ....................... | H02H 9/046 361/56 |
| 9,293,912 B2 | * | 3/2016 | Parthasarathy .......... | H02H 9/04 |
| 9,450,402 B1 | * | 9/2016 | Huang ................... | H02H 9/041 |

(Continued)

FOREIGN PATENT DOCUMENTS

TW   201318148 A1   5/2013

OTHER PUBLICATIONS

Taiwanese Office Action and Search Report, dated May 22, 2017, for Taiwanese Application No. 105135300.

*Primary Examiner* — Thienvu V Tran
*Assistant Examiner* — Christopher J Clark
(74) *Attorney, Agent, or Firm* — Birch, Stewart, Kolasch & Birch, LLP

(57) ABSTRACT

An electrostatic discharge (ESD) protection circuit is provided. A detector is coupled between a first input-output pad and a second input-output pad and detects the voltage levels of the first and second input-output pads to generate a detection signal. A inverter generates a control signal according to the detection signal. A control element is coupled between the first input-output pad and a first node. A current release element is coupled between the first node and the second input-output pad. When the detection signal is at a specific level, the control element and the current release element provide a discharge path to release an ESD current from the first input-output pad to the second input-output pad. When the detection signal is not at the specific level, the control element and the current release element do not provide a discharge path.

15 Claims, 15 Drawing Sheets

(56) References Cited

U.S. PATENT DOCUMENTS

| | | | | |
|---|---|---|---|---|
| 9,793,708 B1* | 10/2017 | Glaser | | H02H 9/046 |
| 2008/0165459 A1* | 7/2008 | Holly | | H02H 9/046 |
| | | | | 361/56 |
| 2008/0197415 A1* | 8/2008 | Yun | | H01L 27/0266 |
| | | | | 257/355 |
| 2008/0198520 A1 | 8/2008 | Yun | | |
| 2008/0297960 A1* | 12/2008 | Chen | | H01L 27/0285 |
| | | | | 361/56 |
| 2009/0267584 A1 | 10/2009 | Ker et al. | | |
| 2013/0027821 A1* | 1/2013 | Chen | | H02H 9/046 |
| | | | | 361/56 |
| 2013/0100561 A1* | 4/2013 | Senouci | | H02H 9/046 |
| | | | | 361/56 |
| 2013/0265676 A1* | 10/2013 | Prabhu | | H02H 9/046 |
| | | | | 361/56 |
| 2014/0063665 A1* | 3/2014 | Chen | | H02H 9/041 |
| | | | | 361/56 |
| 2014/0198415 A1* | 7/2014 | Schulmeyer | | H02H 9/046 |
| | | | | 361/56 |
| 2014/0266104 A1* | 9/2014 | El-Nozahi | | G05F 1/575 |
| | | | | 323/280 |
| 2014/0286085 A1* | 9/2014 | Miyakawa | | G11C 11/1695 |
| | | | | 365/158 |
| 2015/0249334 A1* | 9/2015 | Chen | | H02H 9/046 |
| | | | | 361/56 |
| 2015/0270258 A1* | 9/2015 | Dabral | | H01L 27/0285 |
| | | | | 361/56 |
| 2015/0288173 A1* | 10/2015 | Chen | | H01L 27/0248 |
| | | | | 361/56 |
| 2015/0311700 A1* | 10/2015 | Lee | | H02H 9/04 |
| | | | | 361/56 |
| 2017/0069618 A1* | 3/2017 | Altolaguirre | | H01L 27/0262 |
| 2017/0170165 A1* | 6/2017 | Chen | | H02H 9/046 |
| 2017/0179714 A1* | 6/2017 | Braun | | H02H 1/04 |
| 2017/0366001 A1* | 12/2017 | Cao | | H01L 27/0285 |
| 2018/0026440 A1* | 1/2018 | Zhao | | H02H 9/005 |
| | | | | 361/56 |

* cited by examiner

ELECTROSTATIC DISCHARGE PROTECTION CIRCUIT

BACKGROUND OF THE INVENTION

Field of the Invention

The invention relates to an electrostatic discharge (ESD) protection circuit, and more particularly to an ESD protection circuit with a low leakage current.

Description of the Related Art

Generally, each integrated circuit (IC) comprises at least one input terminal and at least one output terminal. When the input terminal receives high voltage electrostatic charges and the output terminal is grounded, the electrostatic charges pass through the IC and are released to the ground. This release process is referred to as an ESD event. The ability of electrostatic discharge is not plenty. However, ESD energy is great due to the high voltage. If the electrostatic discharge is not processed, the IC will be damaged.

BRIEF SUMMARY OF THE INVENTION

In accordance with an embodiment, an electrostatic discharge (ESD) protection circuit comprises a detector, an inverter, a control element, and a current release element. The detector is coupled between a first input-output pad and a second input-output pad and detects a voltage level of the first input-output pad and a voltage level of the second input-output pad to generate a detection signal. The inverter generates a control signal according to the detection signal. The control element is coupled between the first input-output pad and a first node. The current release element is coupled between the first node and the second input-output pad. When the detection signal is at a specific level, the control element and the current release element provide a discharge path to release an ESD current from the first input-output pad to the second input-output pad. When the detection signal is not at the specific level, the control element and the current release element do not provide the discharge path.

In accordance with another embodiment, an electrostatic discharge protection circuit comprises a detector, a control element, and a current release element. The detector is coupled between a first input-output pad and a second input-output pad and detects a voltage level of the first input-output pad and a voltage level of the second input-output pad to generate a detection signal. The control element is coupled between the first input-output pad and a first node. The current release element is coupled between the first node and the second input-output pad. When the detection signal is at a specific level, the control element and the current release element provide a discharge path to release an ESD current from the first input-output pad to the second input-output pad. When the detection signal is not at the specific level, the control element and the current release element do not provide the discharge path.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
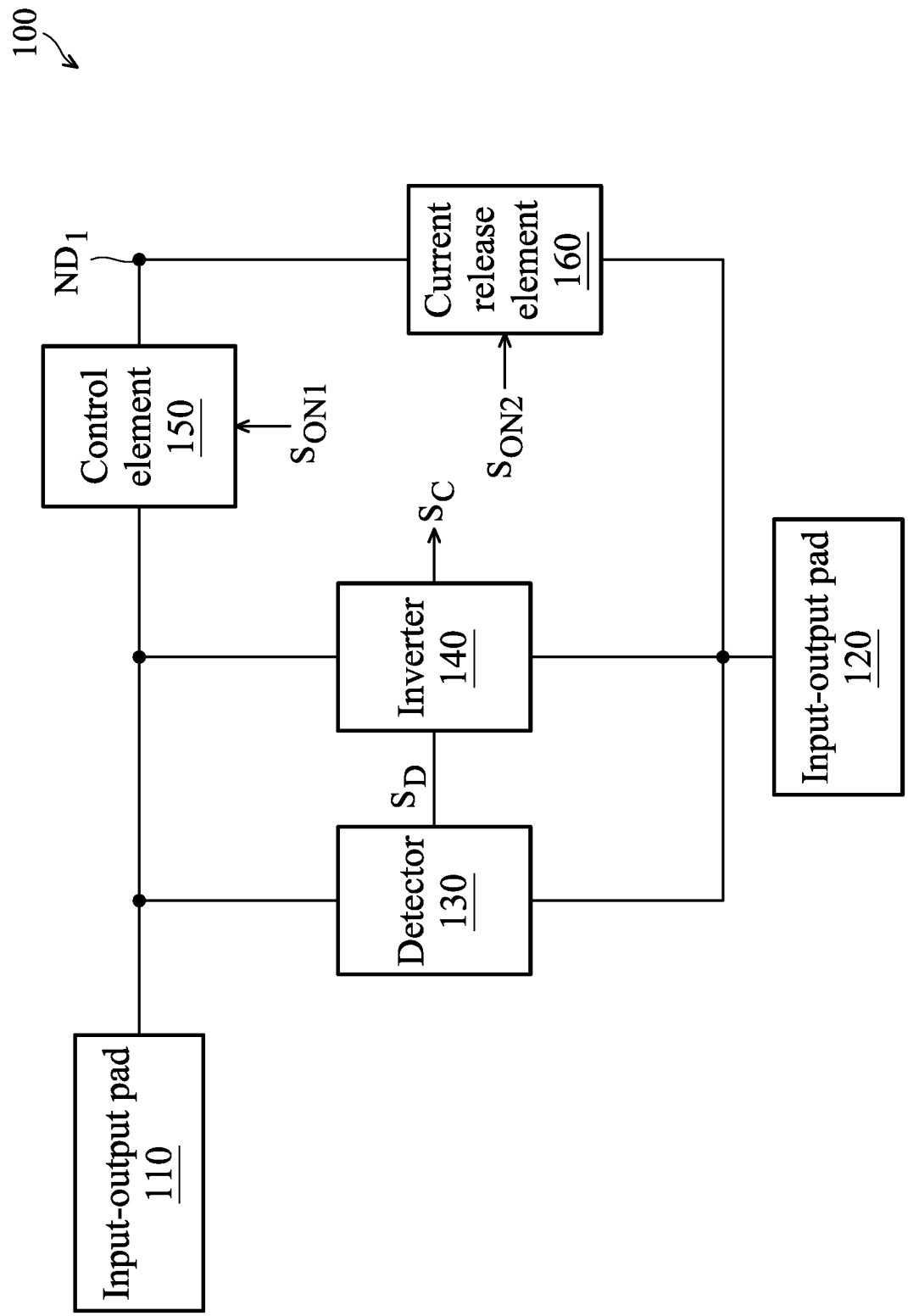
FIG. 1 is a block diagram of an ESD protection circuit of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a block diagram of an ESD protection circuit of the present disclosure. The ESD protection circuit 100 comprises input-output pads 110 and 120, a detector 130, an inverter 140, a control element 150, and a current release element 160. The detector 130 is coupled between the input-output pads 110 and 120 and detects the voltage levels of the input-output pads 110 and 120 to generate a detection signal $S_D$. The invention does not limit the external circuit of the detector 130. In this embodiment, the detector 130 determines whether an ESD event occurs in the input-output pad 110 or 120 according to the voltage levels of the input-output pads 110 and 120. When the ESD event occurs in the input-output pad 110 and the input-output pad 120 is coupled to ground, the detector 130 enables the detection signal at a specific level, such as a high level or a low level. When an ESD event does not occur, the detection signal is not at the specific level.

The inverter 140 generates a control signal $S_C$ according to the detection signal $S_D$. In this embodiment, the voltage level of the detection signal $S_D$ is opposite to the voltage level of the control signal $S_C$. For example, when the detection signal $S_D$ is at a high level, the control signal $S_C$ is at a low level. When the detection signal $S_D$ is at a low level, the control signal $S_C$ is at a high level. As shown in FIG. 1, the inverter 140 is coupled to the input-output pads 110 and 120 and operates according to the voltage levels of the input-output pads 110 and 120.

The control element 150 is coupled between the input-output pad 110 and a node $ND_1$. The invention does not limit the circuit structure of the control element 150. In this embodiment, the control element 150 is a switch controlled by a turn-on signal $S_{ON1}$. When an ESD event occurs, the control element 150 is turned on. When an ESD event does not occur, the control element 150 is not turned on. In one embodiment, the detection signal $S_D$ or the control signal $S_C$ serves as a turn-on signal $S_{ON1}$.

The current release element 160 is coupled between the node $ND_1$ and the input-output pad 120. In this embodiment, the current release element 160 is a switch controlled by a turn-on signal $S_{ON2}$. When an ESD event occurs, the current release element 160 is turned on. When an ESD event does not occur, the current release element 160 is not turned on. In one embodiment, the detection signal $S_D$ or the control signal $S_C$ is capable of serving as a turn-on signal $S_{ON2}$. In other embodiments, the turn-on signal $S_{ON2}$ may be the same as or different from the turn-on signal $S_{ON1}$.

In this embodiment, when an ESD event occurs, the detection signal $S_D$ is at a specific level. At this time, the control element 150 and the current release element 160 are turned on to form a discharge path. An ESD current passes through the input-output pad 110, the control element 150, the current release element 160, and the input-output pad 120. However, when an ESD does not occur, the detection signal $S_D$ is not at the specific level. Therefore, the control element 150 and the current release element 160 are not turned on to stop forming the discharge path. In such cases, since the control element 150 is serially coupled to the current release element 160, the voltage level of the node $ND_1$ is reduced to decrease the leakage current passing through the current release element 160.

Figure 2A:
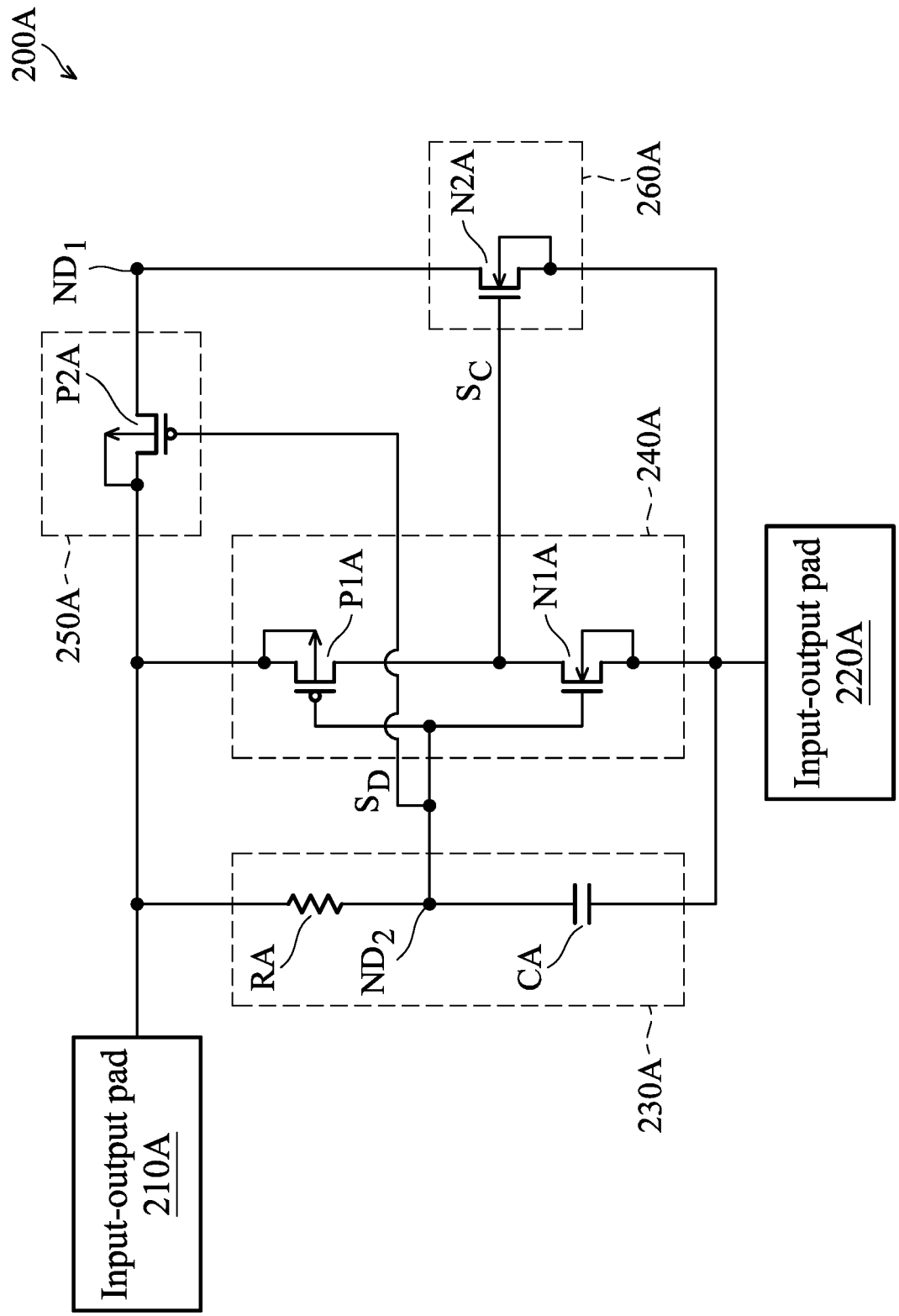
FIGS. 2A-2E are schematic diagrams of exemplary embodiments of the ESD protection circuit, according to various aspects of the present disclosure.

FIG. 2A is a schematic diagram of an exemplary embodiment of the ESD protection circuit, according to various aspects of the present disclosure. In this embodiment, the detector 230A of the ESD protection circuit 200A comprises a resistor RA and a capacitor CA. The resistor RA is coupled between the input-output pad 210A and the node $ND_2$. The capacitor CA is coupled between the node $ND_2$ and the input-output pad 220A. The voltage level of the node $ND_2$ serves as a control signal $S_C$. When an ESD event occurs in the input-output pad 210A and the input-output pad 220A is coupled to ground, the detection signal $S_D$ is at a first level, such as a low level. Conversely, when no ESD event occurs in the input-output pads 210A and 220A, the detection signal $S_D$ is at a second level, such as a high level.

As shown in FIG. 2A, the inverter 240A comprises a P-type transistor P1A and an N-type transistor N1A. The gate of the P-type transistor P1A is coupled to the node $ND_2$ to receive the detection signal $S_D$. The input terminal (e.g. source) of the P-type transistor P1A is coupled to the input-output pad 210A. The output terminal (e.g. drain) of the P-type transistor P1A is coupled to the input terminal (e.g. drain) of the N-type transistor N1A and provides the control signal $S_C$. The bulk of the P-type transistor P1A is coupled to the input-output pad 210A. The gate of the N-type transistor N1A is coupled to the node $ND_2$ to receive the detection signal $S_D$. The output terminal (e.g. source) of the N-type transistor N1A is coupled to the input-output pad 220A. The bulk of the N-type transistor N1A is coupled to the input-output pad 220A.

In this embodiment, the control element 250A is a P-type transistor P2A. The gate of the P-type transistor P2A receives the detection signal $S_D$. The input terminal (e.g. source) and the bulk of the P-type transistor P2A are coupled to the input-output pad 210A. The output terminal (e.g. drain) of the P-type transistor P2A is coupled to the node $ND_1$. When an ESD event occurs in the input-output pad 210A and the input-output pad 220A is coupled to ground, the detection signal $S_D$ is at a low level. Therefore, P-type transistor P2A is turned on. Conversely, when no ESD event occurs in the input-output pads 210A and 220A, the detection signal $S_D$ is at a high level. Therefore, the P-type transistor P2A is turned off.

The current release element 260A is an N-type transistor N2A controlled by the control signal $S_C$. The gate of the N-type transistor N2A receives the control signal $S_C$. The input terminal (e.g. drain) of the N-type transistor N2A is coupled to the node $ND_1$. The output terminal (e.g. source) and the bulk of the N-type transistor N2A are coupled to the input-output pad 220A. When an ESD event occurs in the input-output pad 210A and the input-output pad 220A is coupled to ground, the detection signal $S_D$ is at a low level.

At this time, the control signal $S_C$ is at a high level. Therefore, the N-type transistor N2A is turned on. Since the P-type transistor P2A and the N-type transistor N2A are turned on, an ESD current flows through the input-output pad 210A, the P-type transistor P2A, and the N-type transistor N2A to the input-output pad 220A and is released to ground.

However, when an ESD event does not occur in the input-output pads 210A and 220A, the detection signal $S_D$ is at the high level and the control signal $S_C$ is at the low level. Therefore, the P-type transistor P2A and the N-type transistor N2A are turned off to stop providing a discharge path. At this time, the ESD protection circuit 200A operates in a normal mode (no ESD event). In the normal mode, the input-output pad 210A may receive a first operation voltage, such as 3.3V, and the input-output pad 220A may receive a second operation voltage, such as 0V. Since the P-type transistor P2A has a low off current and the P-type transistor P2A is coupled to the N-type transistor N2A in series, the voltage level of the node $ND_1$ is reduced and less than the first operation voltage received by the input-output pad 210A. Therefore, the voltage crossing the drain and source of the N-type transistor N2A is small such that the leakage current passing through the N-type transistor N2A is reduced.

Figure 2B:
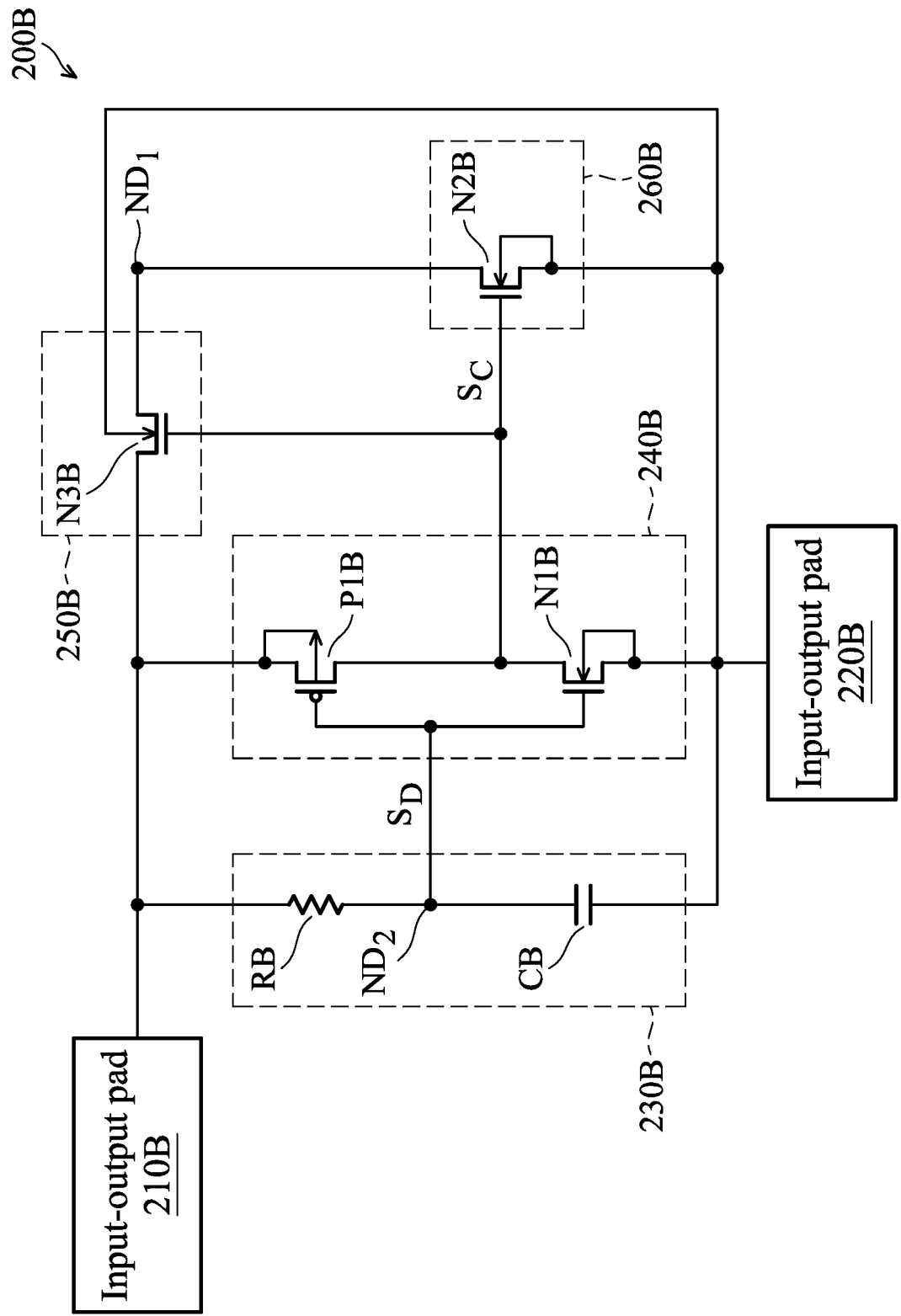

FIG. 2B is a schematic diagram of another exemplary embodiment of the ESD protection circuit, according to various aspects of the present disclosure. FIG. 2B is similar to FIG. 2A with the exception that the control element 250B is an N-type transistor N3B. Since the operations of the detector 230B, the inverter 240B, and the current release element 260B are the same as the operations of the detector 230A, the inverter 240A, and the current release element 260A shown in FIG. 2A, descriptions of the detector 230B, the inverter 240B, and the current release element 260B are omitted.

In this embodiment, the N-type transistor N3B is controlled by the control signal $S_C$. Therefore, the N-type transistors N3B and N2B are turned on or turned off. As shown in FIG. 2B, the gate of the N-type transistor N3B receives the control signal $S_C$. The input terminal (e.g. drain) of the N-type transistor N3B is coupled to the input-output pad 210B. The output terminal (e.g. source) of the N-type transistor N3B is coupled to the node $ND_1$. The bulk of the N-type transistor N3B is coupled to the input-output pad 220B. When an ESD event occurs in the input-output pad 210B and the input-output pad 220B is coupled to ground, the detection signal $S_D$ is at a low level, and the control signal $S_C$ is at a high level. Therefore, the N-type transistors N3B and N2B are turned on. At this time, an ESD current passes from the input-output pad 210B and through the N-type transistors N3B and N2B to the input-output pad 220B so that the ESD current is released to ground. Conversely, when no ESD event occurs, the ESD protection circuit 200B operates in a normal mode. Since the control signal $S_C$ is at the low level, the N-type transistors N3B and N2B are turned off. Since the N-type transistor N3B is coupled to the N-type transistor N2B in series, the voltage difference between the drain and the source of the N-type transistor N2B is reduced. Therefore, the leakage current passing through the N-type transistor N2B is reduced in the normal mode.

Figure 2C:
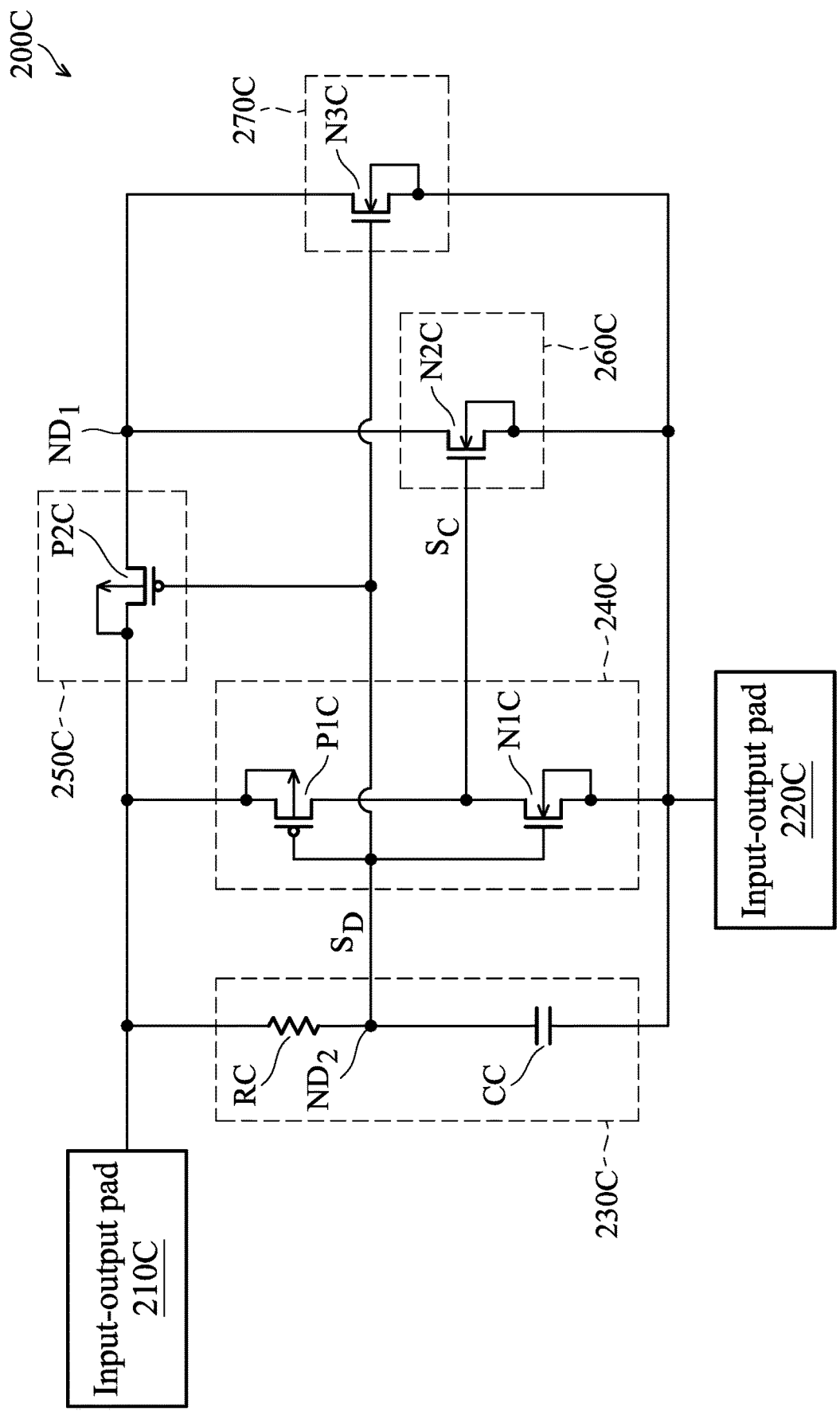

FIG. 2C is a schematic diagram of another exemplary embodiment of the ESD protection circuit, according to various aspects of the present disclosure. FIG. 2C is similar to FIG. 2B except that the ESD protection circuit 200C further comprises a voltage regulator 270C. Since the operations of the detector 230C, the inverter 240C, the control element 250C, and the current release element 260C are the same as the operations of the detector 230A, the inverter 240A, the control element 250A and the current release element 260A shown in FIG. 2A, the descriptions of the detector 230C, the inverter 240C, the control element 250C, and the current release element 260C are omitted.

In this embodiment, the voltage regulator 270C is coupled to the node $ND_1$ and controls the voltage level of the node $ND_1$ according to the detection signal $S_D$. The invention does not limit the circuit structure of the voltage regulator 270C. Any circuit can serve as the voltage regulator 270C, as long as the circuit is capable of controlling the voltage level of the node $ND_1$. In one embodiment, the voltage regulator 270C is a switch. When the detection signal $S_D$ is at a specific level, it means that an ESD event occurs. Therefore, the voltage regulator 270C is turned off to prevent an ESD current from damaging the voltage regulator 270C. When the detection signal $S_D$ is not at the specific level, it means there is no ESD event. Therefore, the voltage regulator 270C is turned on to control the voltage level of the node $ND_1$.

In this embodiment, the voltage regulator 270C is an N-type transistor N3C. The gate of the N-type transistor N3C receives the detection signal $S_D$. The input terminal (e.g. drain) of the N-type transistor N3C is coupled to the node $ND_1$. The output terminal (e.g. source) and the bulk of the N-type transistor N3C are coupled to the input-output pad 220C. In other embodiments, the voltage regulator 270C can be applied in the ESD protection circuit 200B shown in FIG. 2B. In such cases, the voltage regulator 270C may be connected to the current release element 260B in parallel. When the control element 250B and the current release element 260B provide a discharge path, the voltage regulator 270C does not adjust the voltage level of the node $ND_1$. When the control element 250B and the current release element 260B do not provide a discharge path, the voltage regulator 270C adjusts the voltage level of the node $ND_1$.

Figure 2D:
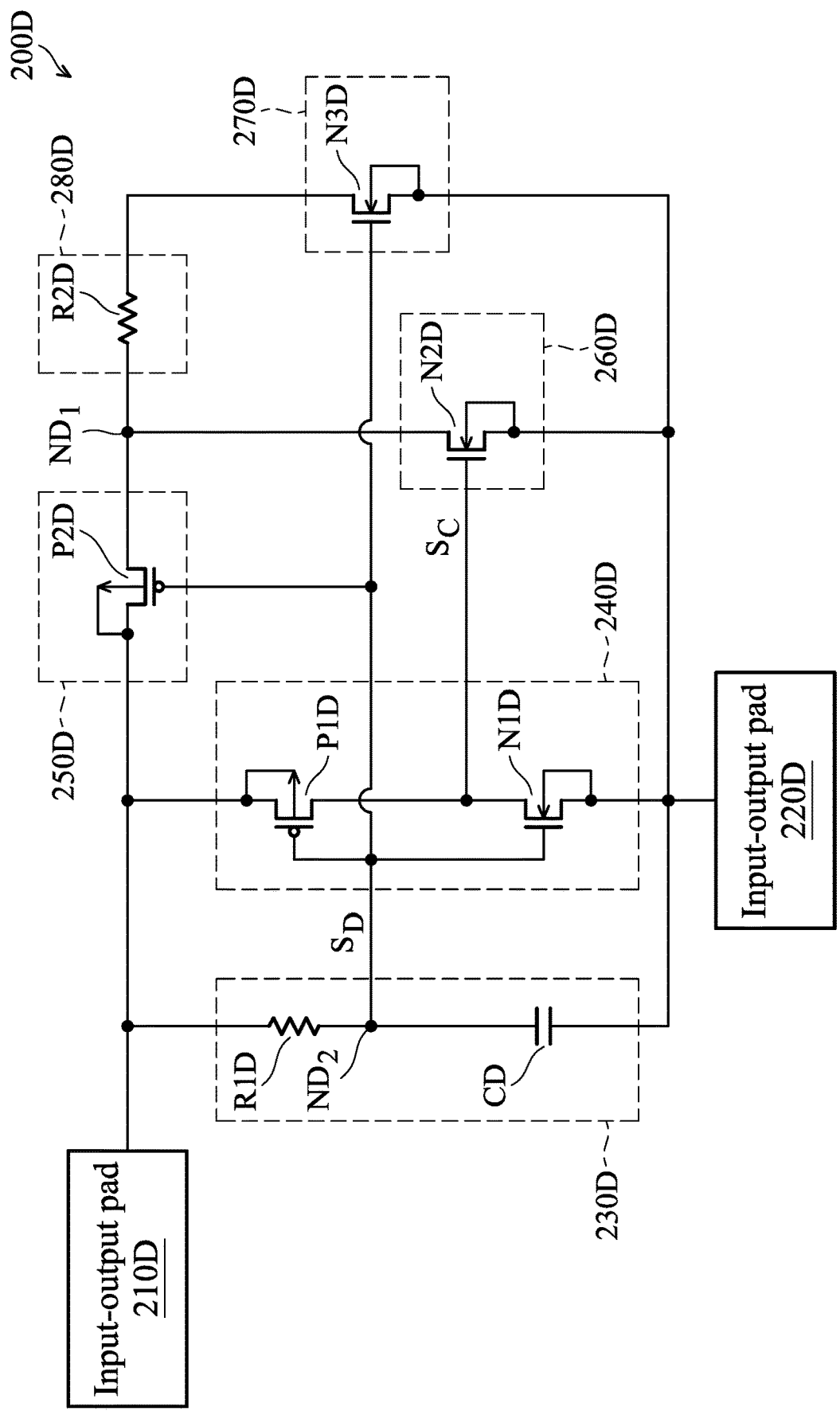

FIG. 2D is a schematic diagram of another exemplary embodiment of the ESD protection circuit, according to various aspects of the present disclosure. FIG. 2D is similar to FIG. 2C except that the ESD protection circuit 200D shown in FIG. 2D further comprises an impedance element 280D. Since the operations of the detector 230D, the inverter 240D, the control element 250D, the current release element 260D, and the voltage regulator 270D are the same as the operations of the detector 230C, the inverter 240C, the control element 250C, the current release element 260C, and the voltage regulator 270C, the descriptions of the detector 230D, the inverter 240D, the control element 250D, the current release element 260D, and the voltage regulator 270D are omitted.

In this embodiment, the impedance element 280D is coupled between the control element 250D and the voltage regulator 270D to protect the voltage regulator 270D and avoid a high current passing through the voltage regulator 270D. The invention does not limit the circuit structure of the impedance element 280D. Any circuit can serve as the impedance element 280D, as long as the circuit is capable of limiting current. In this embodiment, the impedance element 280D is a resistor R2D.

In other embodiments, the voltage regulator 270D and the impedance element 280D can be applied in the ESD protection circuit 200B shown in FIG. 2B. For example, the impedance element 280D is serially connected to the voltage regulator 270D between the node $ND_1$ and the input-output pad 220B.

Figure 2E:
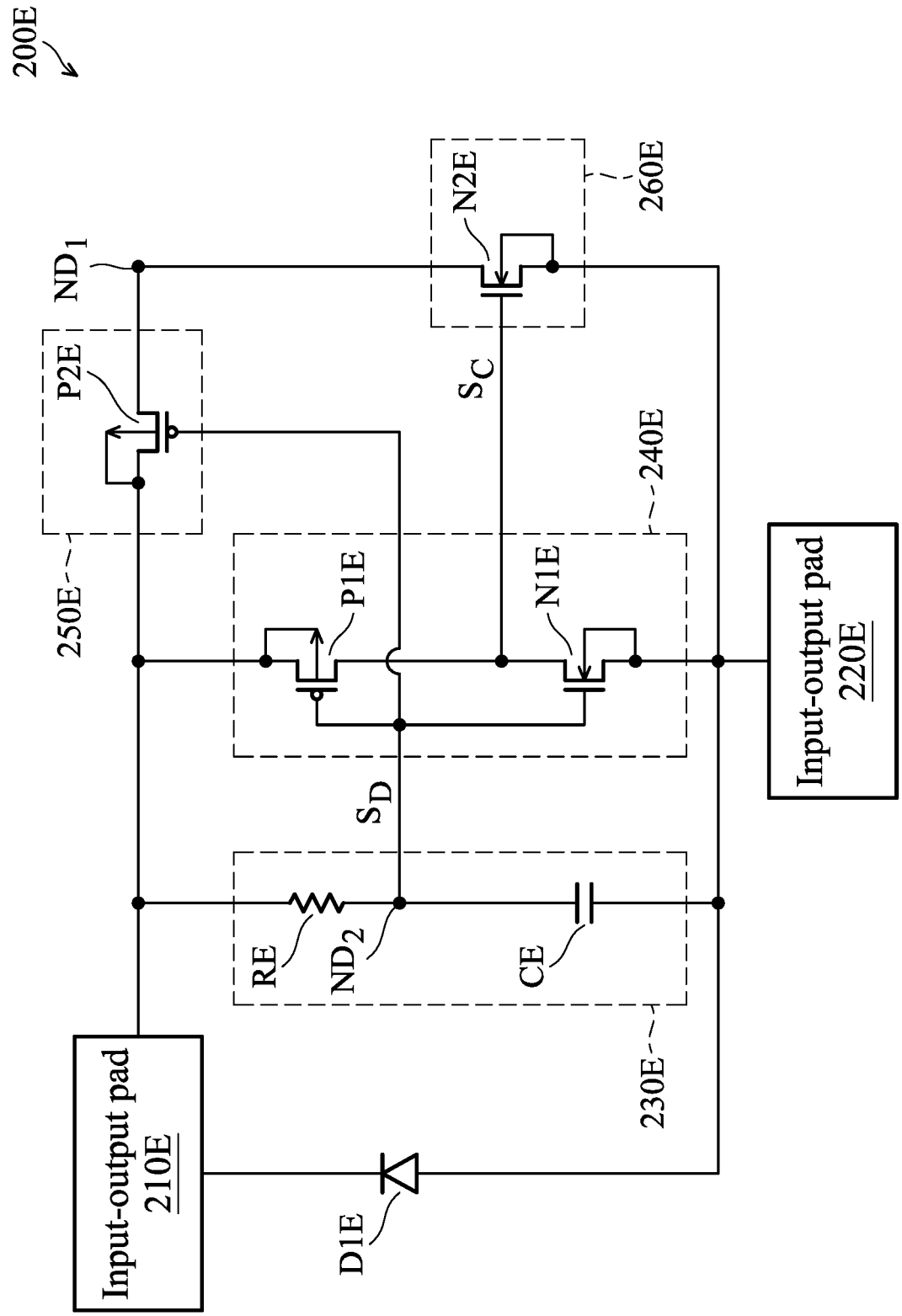

FIG. 2E is a schematic diagram of another exemplary embodiment of the ESD protection circuit, according to various aspects of the present disclosure. FIG. 2E is similar to FIG. 2A except that the ESD protection circuit 200E shown in FIG. 2E further comprises a diode D1E. Since the operations of the detector 230E, the inverter 240E, the control element 250E, and the current release element 260E are the same as the operations of the detector 230A, the inverter 240A, the control element 250A, and the current release element 260A, descriptions of the detector 230E, the inverter 240E, the control element 250E, and the current release element 260E shown in FIG. 2E are omitted.

In this embodiment, the cathode of the diode D1E is coupled to the input-output pad 210E, and the anode of the diode ME is coupled to the input-output pad 220E. When an ESD event occurs in the input-output pad 210E and the input-output pad 220E is coupled to ground, the diode ME is turned on to provide another discharge path and release the ESD current from the input-output pad 210E to the input-output pad 220E. In some embodiments, the diode ME can be applied to the ESD protection circuits 200A-200D shown in FIGS. 2B-2D.

Figure 3A:
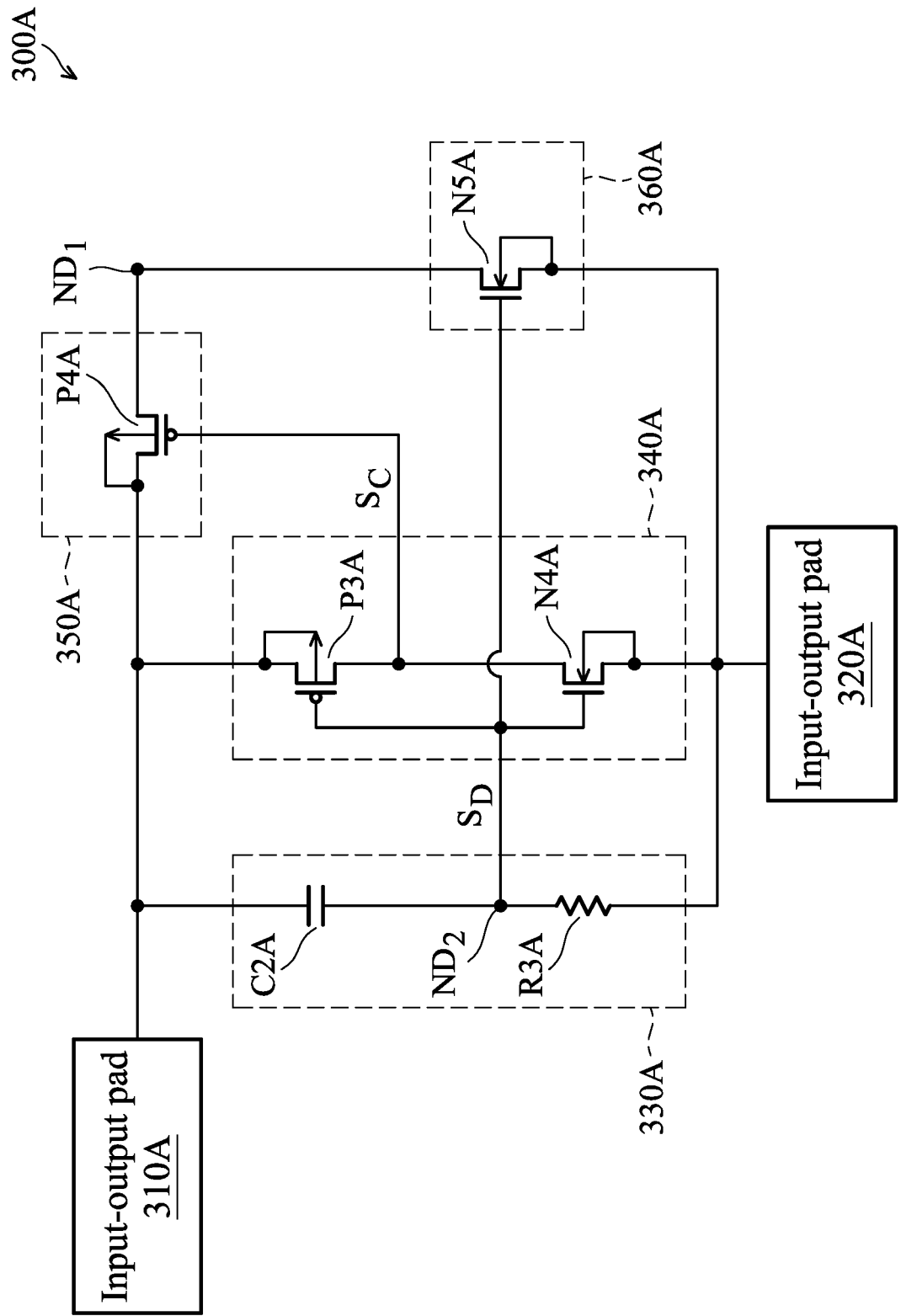
FIGS. 3A-3D are schematic diagrams of exemplary embodiments of the ESD protection circuit, according to various aspects of the present disclosure.

FIG. 3A is a schematic diagram of another exemplary embodiment of the ESD protection circuit, according to various aspects of the present disclosure. FIG. 3A is similar to FIG. 2A except that the detector 330A of the ESD protection circuit 300A is different from the detector 230A of the ESD protection circuit 200A shown in FIG. 2A. Since the operation of the inverter 340A is the same as the operation of the inverter 240A, the description of the inverter 340A shown in FIG. 3A is omitted.

In this embodiment, the detector 330A comprises a capacitor C2A and a resistor R3A. The capacitor C2A is coupled between the input-output pad 310A and the node $ND_2$. The resistor R3A is coupled between the node $ND_2$ and the input-output pad 320A. When an ESD event occurs in the input-output pad 310A and the input-output pad 320A is coupled to ground, the level of the detection signal $S_D$ is a high level. When no ESD event occurs in the input-output pads 310A and 320A, the level of the detection signal $S_D$ is a low level.

The control element 350A is a P-type transistor P4A. The P-type transistor P4A is controlled by the control signal $S_C$. Therefore, when an ESD event occurs in the input-output pad 310A and the input-output pad 320A is coupled to ground, the P-type transistor P4A is turned on. At this time, since the level of the detection signal $S_D$ is the high level, the N-type transistor N5A is turned on. An ESD current flows from the input-output pad 310A and through the P-type transistor P4A and the N-type transistor N5A to the input-output pad 320A.

However, when no ESD event occurs, the P-type transistor P4A and the N-type transistor N5A are turned off. At this time, the ESD protection circuit 300A operates in a normal mode. During the normal mode, the voltage level of the node $ND_1$ is reduced and the leakage current passing through the N-type transistor N5A is reduced due to the P-type transistor P4A and the N-type transistor N5A.

Figure 3B:
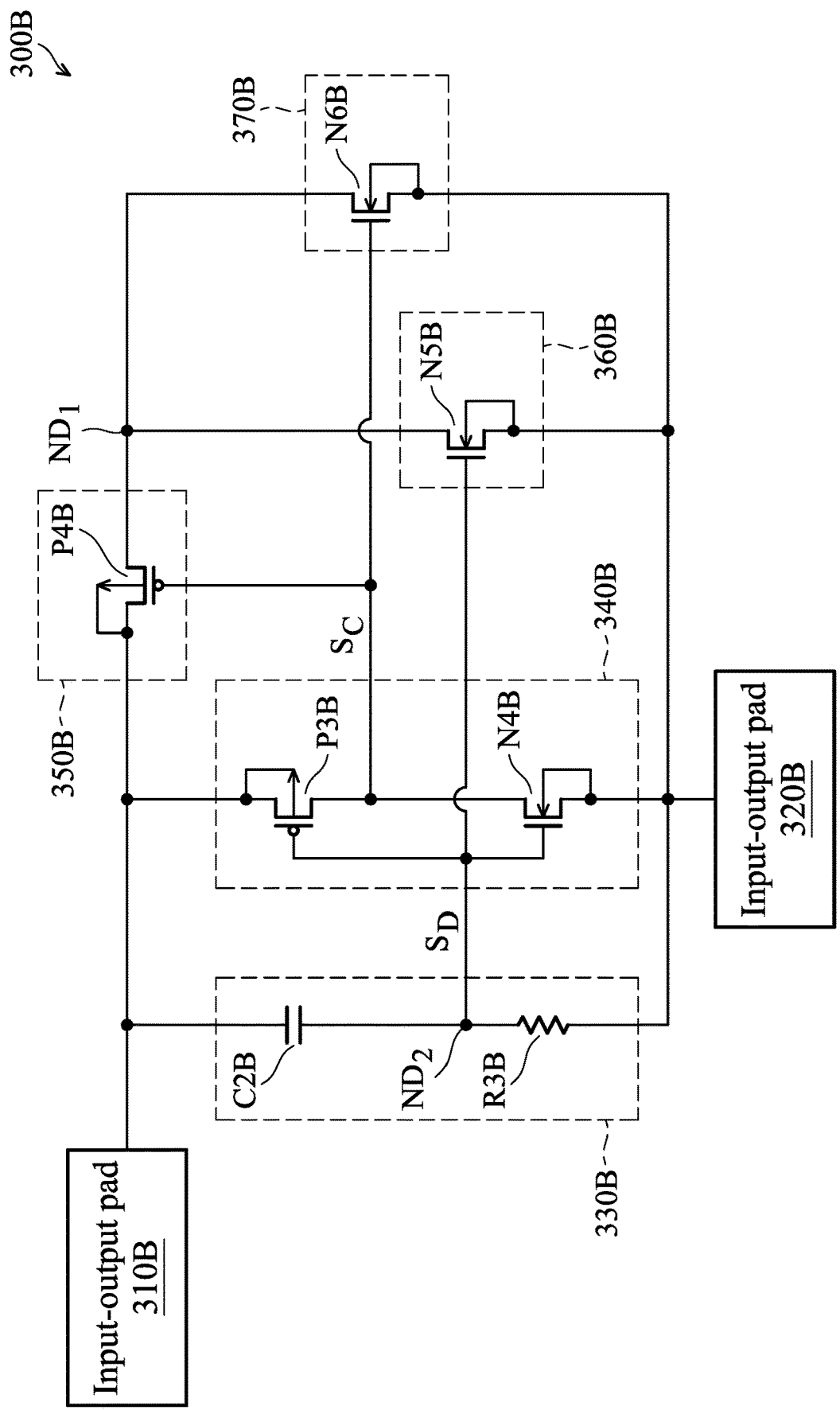

FIG. 3B is a schematic diagram of another exemplary embodiment of the ESD protection circuit, according to various aspects of the present disclosure. FIG. 3B is similar to FIG. 3A except that the ESD protection circuit 300B further comprises a voltage regulator 370B. The voltage regulator 370B is coupled between the node $ND_1$ and the input-output pad 320B. In this embodiment, the voltage regulator 370B is controlled by the control signal $S_C$. Since the operation of the voltage regulator 370B is the same as the voltage regulator 270C shown in FIG. 2C, the description of the voltage regulator 370B is omitted. In addition, the operations of the detector 330B, the inverter 340B, the control element 350B, and the current release element 360B are the same as the operations of the detector 330A, the inverter 340A, the control element 350A, and the current release element 360A shown in FIG. 3A such that the descriptions of the detector 330B, the inverter 340B, the control element 350B, and the current release element 360B are omitted.

Figure 3C:
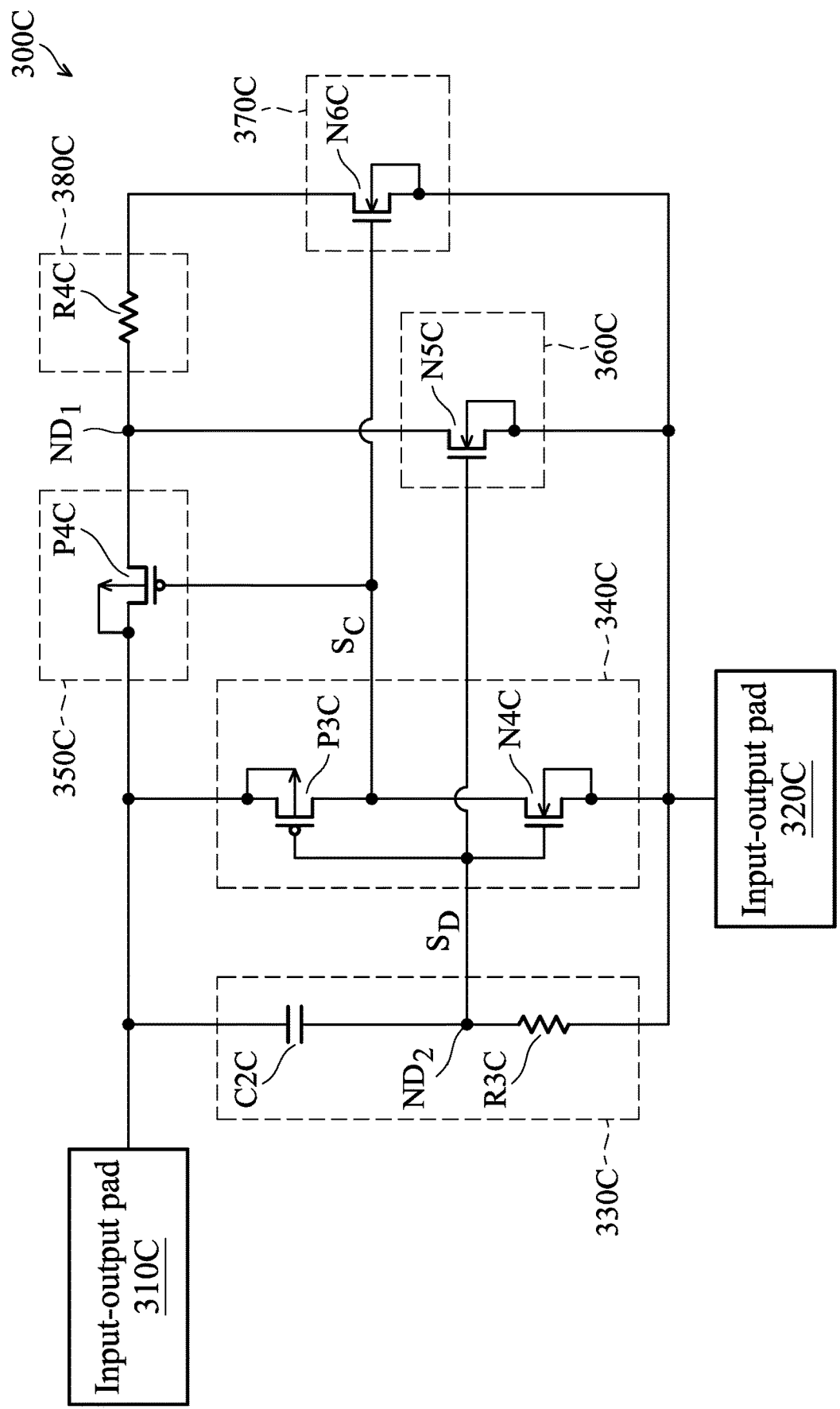

FIG. 3C is a schematic diagram of another exemplary embodiment of the ESD protection circuit, according to various aspects of the present disclosure. FIG. 3C is similar to FIG. 3B except that the ESD protection circuit 300C further comprises an impedance element 380C. The impedance element 380C is coupled between the control element 350C and the voltage regulator 370C. Since the operation of the impedance element 380C is the same as the operation of the impedance element 280D shown in FIG. 2D, the description of the impedance element 380C is omitted. Furthermore, since the operations of the detector 330C, the inverter 340C, the control element 350C, the current release element 360C, and the voltage regulator 370C are the same as the operations of the detector 330B, the inverter 340B, the control element 350B, the current release element 360B, and the voltage regulator 370B, descriptions of the detector 330C, the inverter 340C, the control element 350C, the current release element 360C, and the voltage regulator 370C are omitted.

Figure 3D:
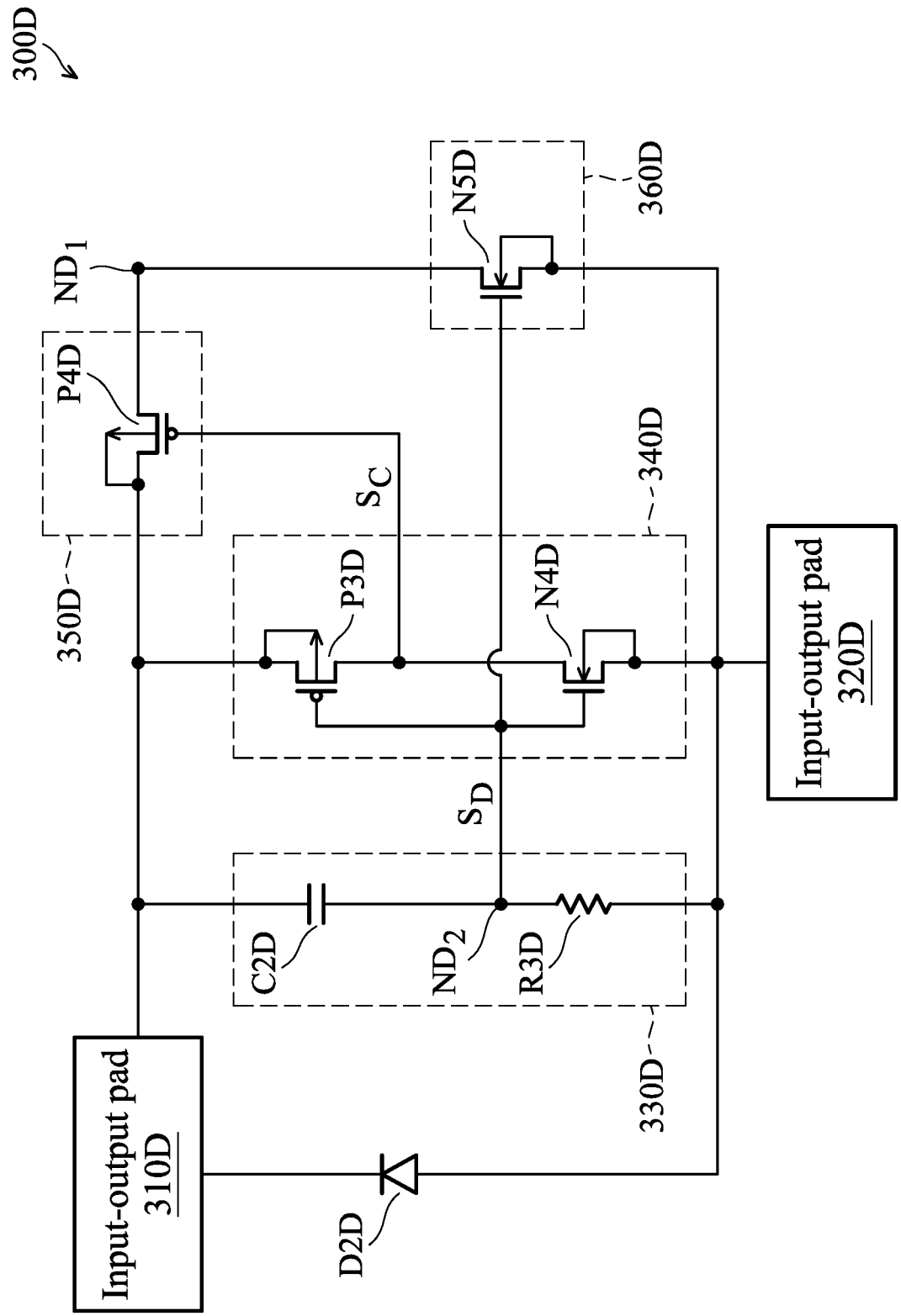

FIG. 3D is a schematic diagram of another exemplary embodiment of the ESD protection circuit, according to various aspects of the present disclosure. FIG. 3D is similar to FIG. 3A except that the ESD protection circuit 300D further comprises a diode D2D. The cathode of the diode D2D is coupled to the input-output pad 310D. The anode of the diode D2D is coupled to the input-output pad 320D. Since the operation of the diode D2D is the same as the operation of the diode D1E shown in FIG. 2E, the description of the diode D2D is omitted. In some embodiments, the diode D2D can be applied to FIGS. 3B and 3C. In addition, the operations of the detector 330D, the inverter 340D, the control element 350D, and the current release element 360D are the same as the operations of the detector 330A, the inverter 340A, the control element 350A, and the current release element 360A such that the descriptions of the detector 330D, the inverter 340D, the control element 350D, and the current release element 360D are omitted.

Figure 4A:
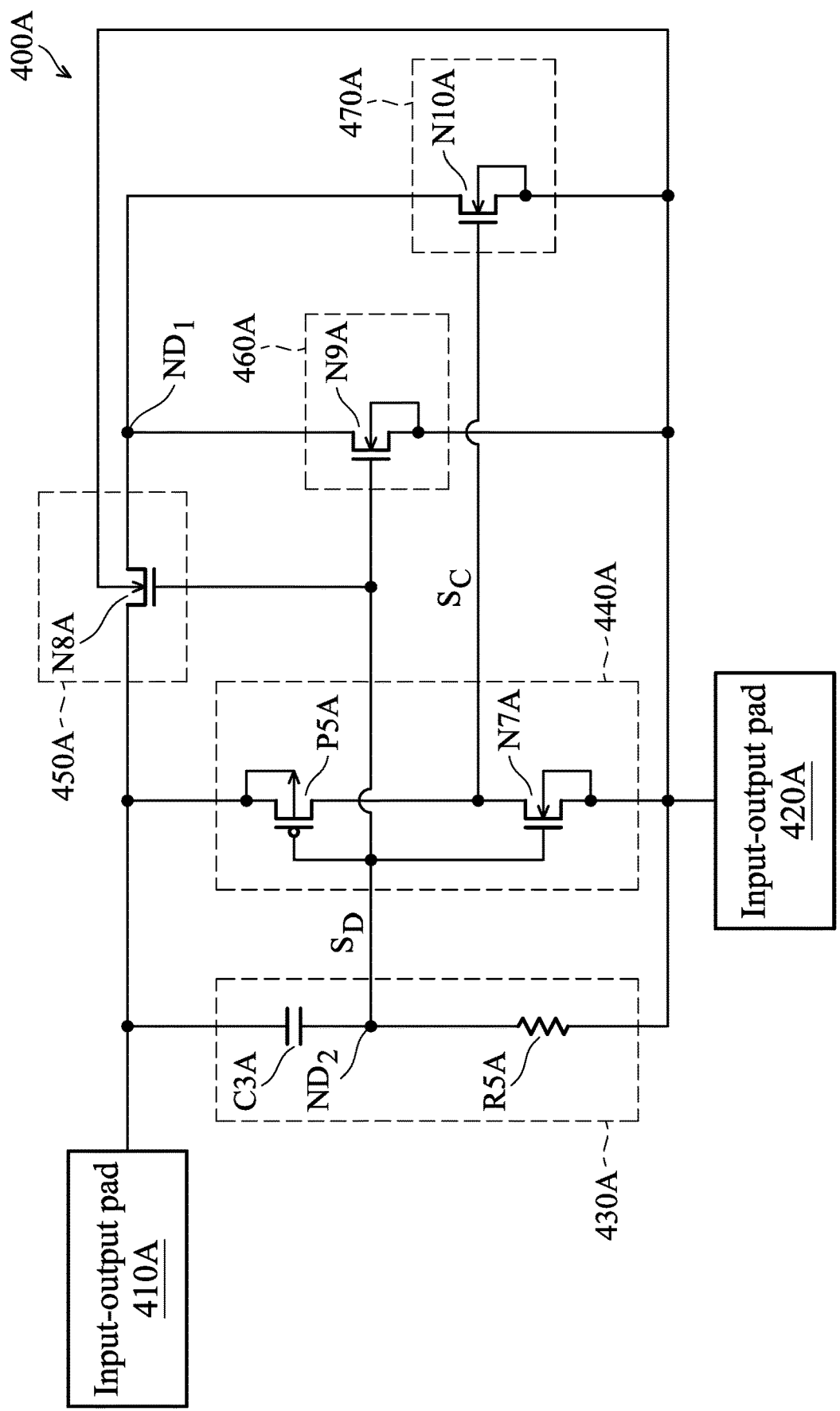
FIGS. 4A-4E are schematic diagrams of exemplary embodiments of the ESD protection circuit, according to various aspects of the present disclosure.

FIG. 4A is a schematic diagram of another exemplary embodiment of the ESD protection circuit, according to various aspects of the present disclosure. FIG. 4A is similar to FIG. 3A except that the control element 450A shown in FIG. 4A is an N-type transistor N8A and the ESD protection circuit 400A shown in FIG. 4A further comprises a voltage regulator 470A. Since the operations of the detector 430A, the inverter 440A, and the current release element 460A are the same as the operations of the detector 330A, the inverter 340A, and the current release element 360A shown in FIG. 3A, the descriptions of the detector 430A, the inverter 440A, and the current release element 460A are omitted.

The gate of the N-type transistor N8A receives the detection signal $S_D$. The input terminal (e.g. drain) of the N-type transistor N8A is coupled to the input-output pad 410A. The output terminal (e.g. source) of the N-type transistor N8A is coupled to the node $ND_1$. The bulk of the N-type transistor N8A is coupled to the input-output pad 420A. When an ESD event occurs, the N-type transistors N8A and N9A form a discharge path. When no ESD event occurs, the N-type transistor N8A is turned off. At this time, the voltage regulator 470A controls the voltage level of the node $ND_1$. In this embodiment, the voltage regulator 470A is an N-type transistor N10A.

The gate of the N-type transistor N10A receives the control signal $S_C$. The input terminal (e.g. drain) of the N-type transistor N10A is coupled to the node $ND_1$. The input terminal (e.g. drain) and the bulk of the N-type transistor N10A is coupled to the input-output pad 420A. When an ESD event occurs, the detection signal $S_D$ is at a high level. At this time, the control signal $S_C$ is at a low level. Therefore, the N-type transistor N10A is turned off. However, when no ESD event occurs, the detection signal $S_D$ is at a low level. In such cases, the control signal $S_C$ is at a high level. Therefore, the N-type transistor N10A is turned on to adjust the voltage level of the node $ND_1$.

Figure 4B:
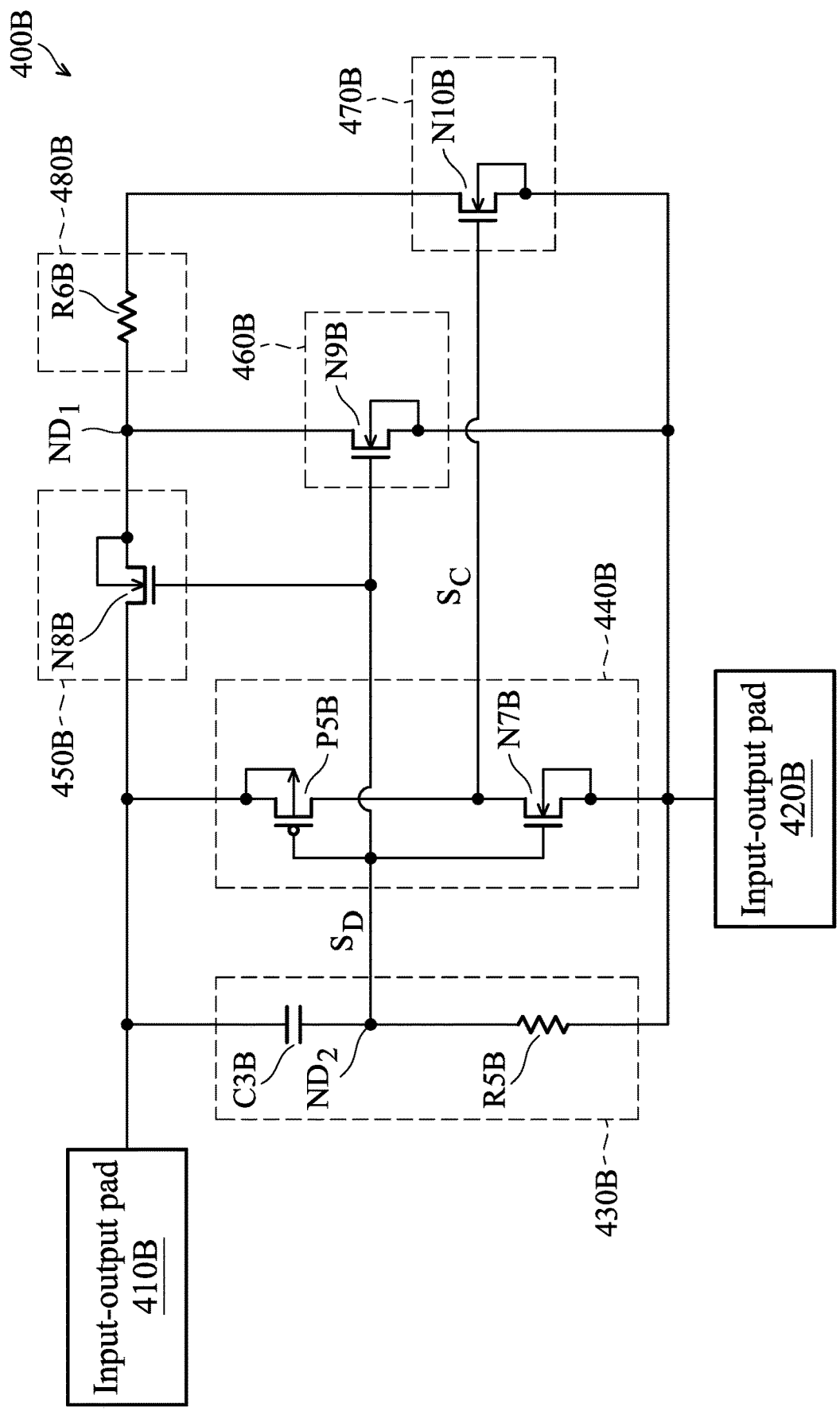

FIG. 4B is a schematic diagram of another exemplary embodiment of the ESD protection circuit, according to various aspects of the present disclosure. FIG. 4B is similar to FIG. 4A except that the ESD protection circuit 400B further comprises an impedance element 480B. The impedance element 480B is configured to protect the voltage regulator 470B to avoid a high current entering the voltage regulator 470B. In this embodiment, the impedance element 480B is a resistor R6B. The resistor R6B is coupled between the control element 450B and the current release element 470B.

Since the operations of the detector 430B, the inverter 440B, the control element 450B, the current release element 460B, and the voltage regulator 470B are the same as the operations of the detector 430A, the inverter 440A, the control element 450A, the current release element 460A, and the voltage regulator 470A shown in FIG. 4A, descriptions of the detector 430B, the inverter 440B, the control element 450B, the current release element 460B, and the voltage regulator 470B are omitted.

Figure 4C:
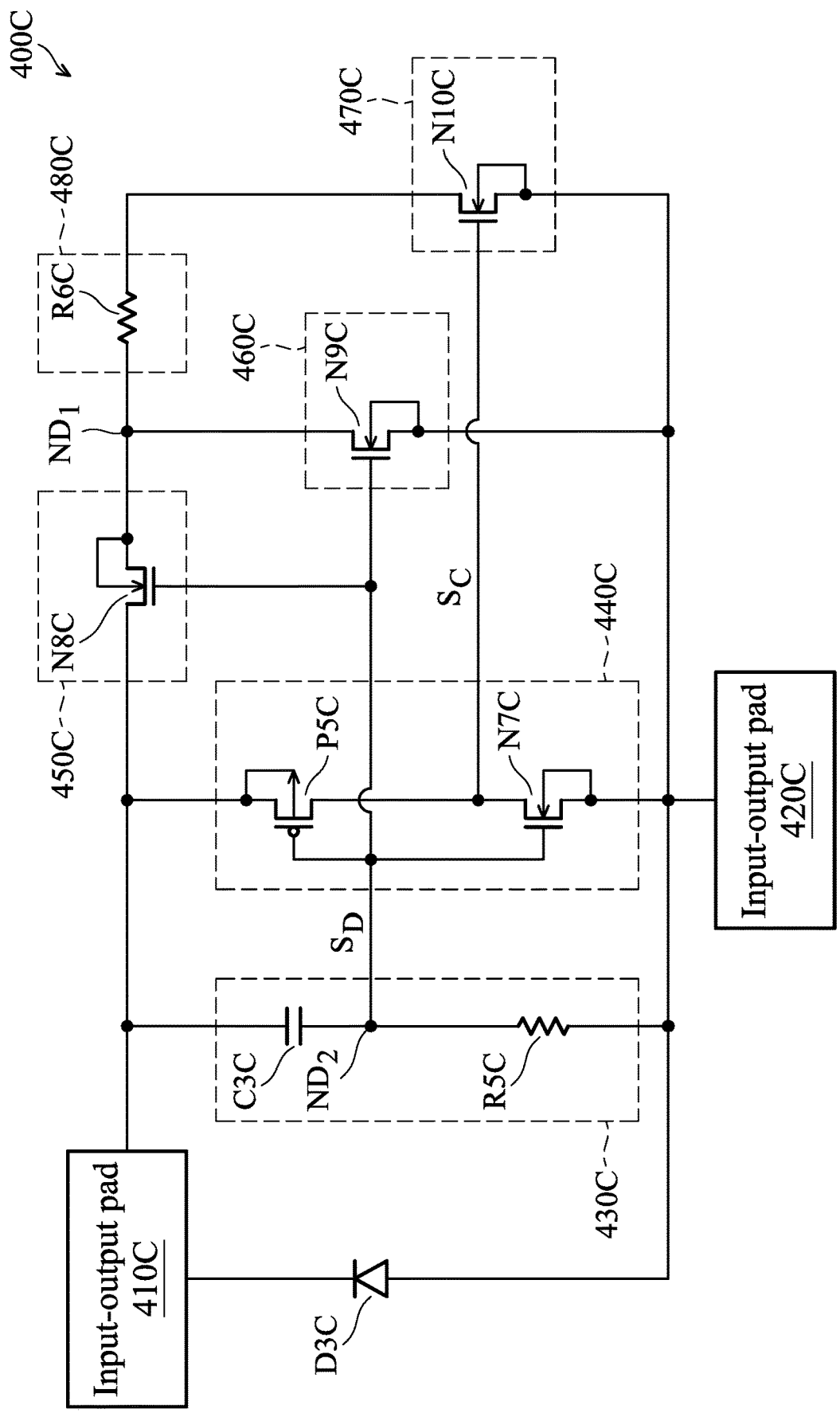

FIG. 4C is a schematic diagram of another exemplary embodiment of the ESD protection circuit, according to various aspects of the present disclosure. FIG. 4C is similar to FIG. 4B except that the ESD protection circuit 400C further comprises a diode D3C. The cathode of the diode D3C is coupled to the input-output pad 410C. The anode of the diode D3C is coupled to the input-output pad 420C. The diode D3C is configured to provide another discharge path to release an ESD current. When an ESD event occurs, the control element 450C and the current release element 460C provide a discharge path, and the diode D3C provides another discharge path to increase the speed of discharge. Since the operation of the diode D3C is the same as the diode ME shown in FIG. 2E, the description of the diode D3C is omitted.

Figure 4D:
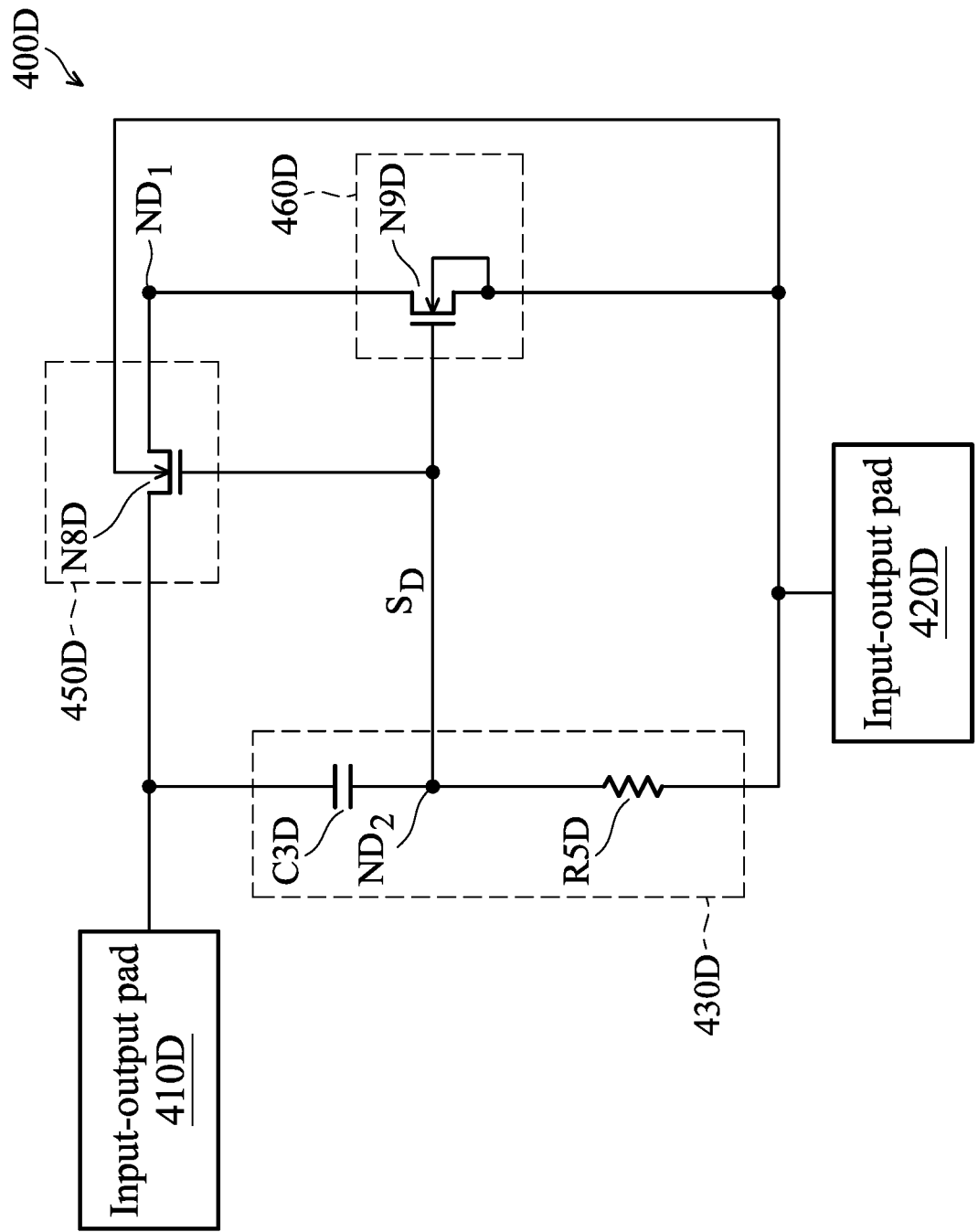

FIG. 4D is a schematic diagram of another exemplary embodiment of the ESD protection circuit, according to various aspects of the present disclosure. The ESD protection circuit 400D comprises a detector 430D, a control element 450D, and a current release element 460D. Since the structure of the detector 430D is the same as the structure of the detector 330A shown in FIG. 3A, the description of the detector 430D is omitted. In this embodiment, the control element 450D and the current release element 460D are controlled by the detection signal $S_D$. when the detection signal $S_D$ is at a specific level, it means that an ESD event occurs. Therefore, the control element 450D and the current release element 460D provide a discharge path to release the ESD current.

In this embodiment, the control element 450D is an N-type transistor N8D. The gate of the N-type transistor N8D receives the detection signal $S_D$. The input terminal (e.g. drain) of the N-type transistor N8D is coupled to the input-output pad 410D. The output terminal (e.g. source) of the N-type transistor N8D is coupled to the node $ND_1$. The bulk of the N-type transistor N8D is coupled to the input-output pad 420D. Furthermore, the current release element 460D is an N-type transistor N9D. The gate of the N-type transistor N9D receives the detection signal $S_D$. The input terminal (e.g. drain) of the N-type transistor N9D is coupled to the node $ND_1$. The output terminal (e.g. source) and the bulk of the N-type transistor N9D is coupled to the input-output pad 420D. When the detection signal $S_D$ is at a high level, the N-type transistors N8D and N9D are turned on. When the detection signal $S_D$ is at a low level, the N-type transistors N8D and N9D are turned off. However, since the N-type transistor N8D is connected to the N-type transistor N9D in series, the voltage level of the node $ND_1$ is reduced. Therefore, the leakage current passing through the N-type transistor N9D is reduced in a normal mode (no ESD event).

Figure 4E:
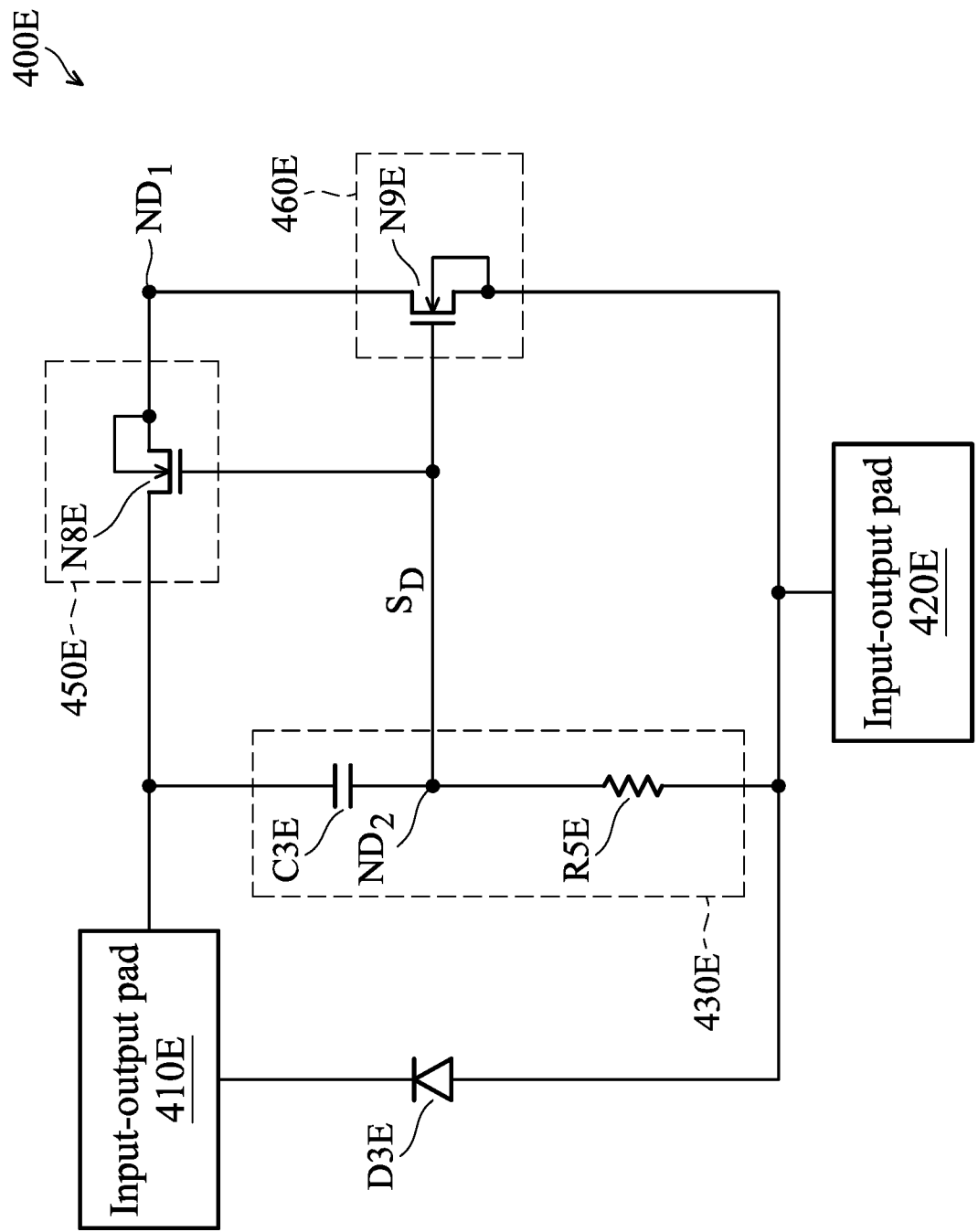

FIG. 4E is schematic diagram of another exemplary embodiment of the ESD protection circuit, according to various aspects of the present disclosure. FIG. 4E is similar to FIG. 4D except that the ESD protection circuit 400E further comprises a diode D3E. The diode D3E is configured to provide another discharge path to release an ESD current fast. The cathode of the diode D3E is coupled to the input-output pad 410E. The anode of the diode D3E is coupled to the input-output pad 420E. Since the operations of the detector 430E, the control element 450E, and the current release element 460E are the same as the operations of the detector 430D, the control element 450D, and the current release element 460D shown in FIG. 4D, descriptions of the detector 430E, the control element 450E, and the current release element 460E are omitted.

When an ESD event occurs, an ESD protection circuit enters a protection mode. In the protection mode, a control element and a current release element form a discharge path to discharge the ESD current. In one embodiment, a diode is disposed between two input-output pads shown in FIG. 2E to increase the speed of discharge.

When no ESD event occurs, the ESD protection circuit enters a normal mode. In the normal mode, since the control element is coupled to the current release element in series, the voltage crossing the current release element is decreased to reduce the leakage current passing through the current release element. In some embodiments, a voltage regulator (shown in FIG. 2C) is utilized to control the voltage crossing the current release element. In other embodiments, a protection element (e.g. the impedance element 280D) is disposed between the voltage regulator and the current release element to avoid a high current entering the voltage regulator.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electrostatic discharge (ESD) protection circuit, comprising:
    a detector coupled between a first input-output pad and a second input-output pad and detecting a voltage level of the first input-output pad and a voltage level of the second input-output pad to generate a detection signal;
    an inverter generating a control signal according to the detection signal;
    a control element coupled between the first input-output pad and a first node;
    a voltage regulator directly connected to the first node and controlling a voltage level of the first node according to the detection signal; and
    a current release element coupled between the first node and the second input-output pad,
    wherein when the detection signal is at a specific level, the control element and the current release element provide a discharge path to release an ESD current from the first input-output pad to the second input-output pad, and
    wherein when the detection signal is not at the specific level, the control element and the current release element do not provide the discharge path,
    wherein:
    responsive to the detection signal being at the specific level, the voltage regulator is turned off to prevent the ESD current from damaging the voltage regulator, and
    responsive to the detection signal not being at the specific level, the voltage regulator is turned on.

2. The electrostatic discharge protection circuit as claimed in claim 1, wherein the detector comprises:
    a resistor coupled between the first input-output pad and a second node; and
    a capacitor coupled between the second node and the second input-output pad.

3. The electrostatic discharge protection circuit as claimed in claim 2, wherein the control element is a P-type transistor, and the P-type transistor comprises a gate receiving the detection signal, an input terminal coupled to the first input-output pad, and an output terminal coupled to the first node,
    wherein the current release element is an N-type transistor, and the N-type transistor comprises a gate receiving the control signal, an input terminal coupled to the first node, and an output terminal coupled to the second input-output pad.

4. The electrostatic discharge protection circuit as claimed in claim 2, wherein the control element is a first N-type transistor, and the first N-type transistor comprises a gate receiving the control signal, an input terminal coupled to the first input-output pad, and an output terminal coupled to the first node,
    wherein the current release element is a second N-type transistor, and the second N-type transistor comprises a gate receiving the control signal, an input terminal coupled to the first node, and an output terminal coupled to the second input-output pad.

5. The electrostatic discharge protection circuit as claimed in claim 1, wherein the detector comprises:
    a capacitor coupled between the first input-output pad and a second node; and a resistor coupled between the second node and the second input-output pad.

6. The electrostatic discharge protection circuit as claimed in claim 5, wherein the control element is a P-type transistor, and the P-type transistor comprises a gate receiving the control signal, an input terminal coupled to the first input-output pad, and an output terminal coupled to the first node,
wherein the current release element is an N-type transistor, and the N-type transistor comprises a gate receiving the detection signal, an input terminal coupled to the first node, and an output terminal coupled to the second input-output pad.

7. The electrostatic discharge protection circuit as claimed in claim 5, wherein the control element is a first N-type transistor, and the first N-type transistor comprises a gate receiving the detection signal, an input terminal coupled to the first input-output pad, and an output terminal coupled to the first node,
wherein the current release element is a second N-type transistor, and the second N-type transistor comprises a gate receiving the detection signal, an input terminal coupled to the first node, and an output terminal coupled to the second input-output pad.

8. The electrostatic discharge protection circuit as claimed in claim 1, wherein the voltage regulator is a switch.

9. The electrostatic discharge protection circuit as claimed in claim 8, wherein the switch is an N-type transistor, and the N-type transistor comprises a gate receiving the detection signal, an input terminal coupled to the first node, and an output terminal coupled to the second input-output pad.

10. The electrostatic discharge protection circuit as claimed in claim 1, further comprising:
a diode comprising a cathode coupled to the first input-output pad and an anode coupled to the second input-output pad, wherein when an ESD event occurs in the first input-output pad and the second input-output pad is coupled to ground, the diode is turned on to release an ESD current from the first input-output pad to the second input-output pad.

11. An electrostatic discharge (ESD) protection circuit, comprising:
a detector coupled between a first input-output pad and a second input-output pad and detecting a voltage level of the first input-output pad and a voltage level of the second input-output pad to generate a detection signal;
an inverter generating a control signal according to the detection signal;
a control element coupled between the first input-output pad and a first node;
a voltage regulator controlling a voltage level of the first node according to the detection signal;
a current release element coupled between the first node and the second input-output pad; and
an impedance element comprising a first terminal and a second terminal, wherein the first terminal is directly connected to the first node, and the second terminal is directly connected to the voltage regulator,
wherein when the detection signal is at a specific level, the control element and the current release element provide a discharge path to release an ESD current from the first input-output pad to the second input-output pad, and
wherein when the detection signal is not at the specific level, the control element and the current release element do not provide the discharge path.

12. The electrostatic discharge protection circuit as claimed in claim 11, wherein the impedance element is configured to protect the voltage regulator.

13. The electrostatic discharge protection circuit as claimed in claim 11, wherein the voltage regulator is a first N-type transistor, and the first N-type transistor comprises a gate receiving the detection signal, an input terminal directly connected to the second terminal of the impedance element, and an output terminal coupled to the second input-output pad,
wherein the control element is a P-type transistor, and the P-type transistor comprises a gate receiving the detection signal, an input terminal coupled to the first input-output pad, and an output terminal directly connected to the first node,
wherein the current release element is a second N-type transistor, and the second N-type transistor comprises a gate receiving the control signal, an input terminal coupled to the first node, and an output terminal coupled to the second input-output pad.

14. The electrostatic discharge protection circuit as claimed in claim 11, wherein the voltage regulator is a first N-type transistor, and the first N-type transistor comprises a gate receiving the control signal, an input terminal directly connected to the second terminal of the impedance element, and an output terminal coupled to the second input-output pad,
wherein the control element is a P-type transistor, and the P-type transistor comprises a gate receiving the control signal, an input terminal coupled to the first input-output pad, and an output terminal directly connected to the first node,
wherein the current release element is a second N-type transistor, and the second N-type transistor comprises a gate receiving the detection signal, an input terminal coupled to the first node, and an output terminal coupled to the second input-output pad.

15. The electrostatic discharge protection circuit as claimed in claim 11, wherein the voltage regulator is a first N-type transistor, and the first N-type transistor comprises a gate receiving the control signal, an input terminal directly connected to the second terminal of the impedance element, and an output terminal coupled to the second input-output pad,
wherein the control element is a second N-type transistor, and the second N-type transistor comprises a gate receiving the detection signal, an input terminal coupled to the first input-output pad, and an output terminal directly connected to the first node,
wherein the current release element is a third N-type transistor, and the third N-type transistor comprises a gate receiving the detection signal, an input terminal coupled to the first node, and an output terminal coupled to the second input-output pad.

* * * * *